Figure 1:
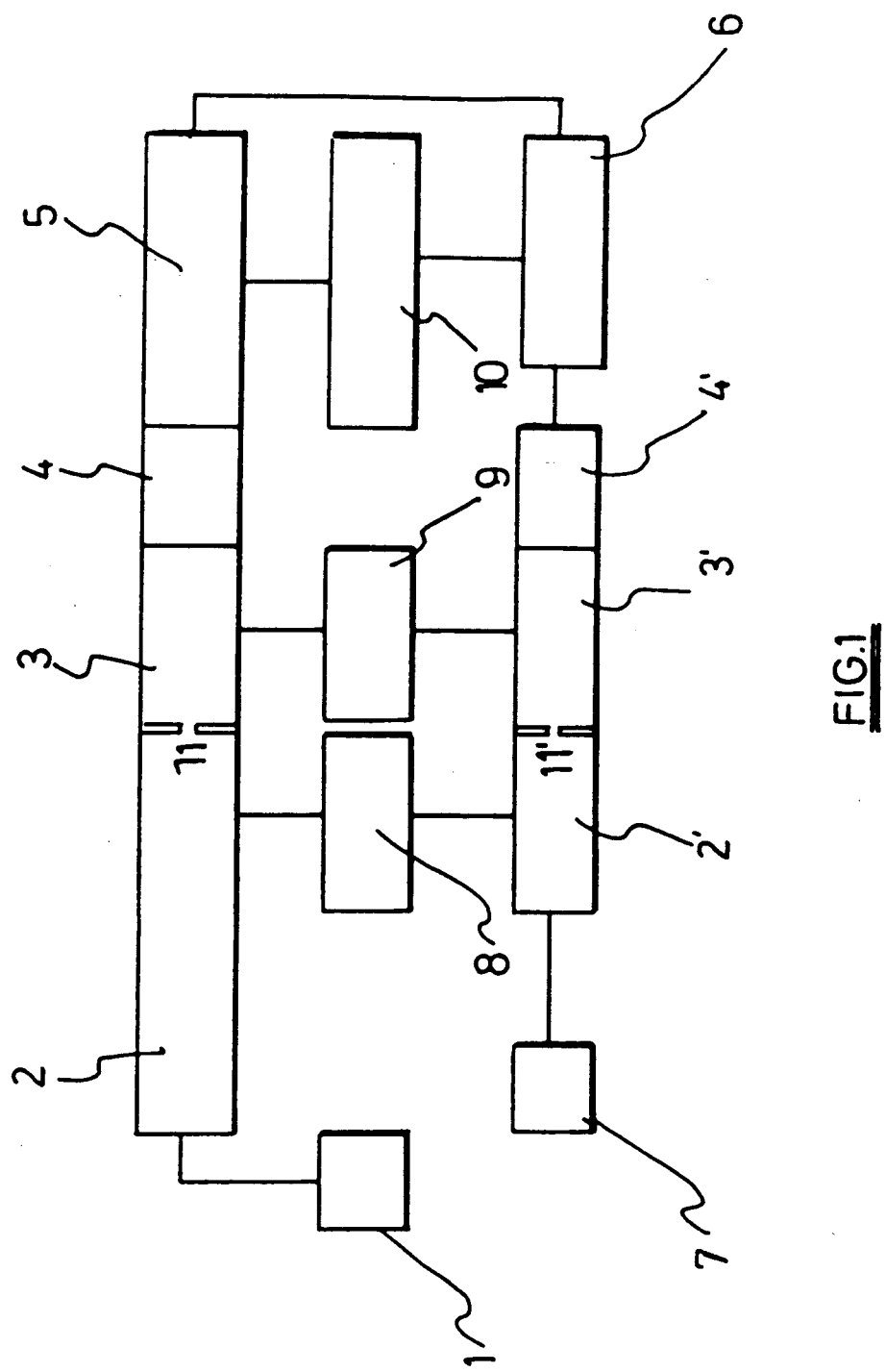

United States Patent [19]

Lievens et al.

[11] Patent Number: 5,057,199
[45] Date of Patent: Oct. 15, 1991

[54] PROCESS AND APPARATUS FOR THE TREATMENT OF COATED, ELONGATED SUBSTRATE, AS WELL AS SUBSTRATES THUS TREATED AND ARTICLES OF POLYMERIC MATERIAL REINFORCED WITH THESE SUBSTRATES

[75] Inventors: Hugo Lievens, Gent; Wilfried Coppens, Kortrijk-Marke, both of Belgium

[73] Assignee: N. V. Bekaert S. A., Zwevegem, Belgium

[21] Appl. No.: 418,996

[22] Filed: Oct. 10, 1989

Related U.S. Application Data

[63] Continuation of Ser. No. 107,412, Oct. 13, 1987, abandoned.

[30] Foreign Application Priority Data

Oct. 31, 1986 [NL] Netherlands .................. 8602759

[51] Int. Cl.⁵ .......................................... C23C 14/34
[52] U.S. Cl. ...................... 204/192.15; 204/192.22
[58] Field of Search ............... 204/192.15, 192.12, 204/298 TT, 298 SC, 298 SM, 192.22, 298.06, 298.23, 298.24

[56] References Cited

U.S. PATENT DOCUMENTS

| | | | |
|---|---|---|---|
| 3,278,331 | 10/1966 | Taylor | 117/107.1 |
| 3,627,663 | 12/1971 | Davidse et al. | 204/192.12 X |
| 3,652,443 | 3/1972 | Fish et al. | 204/192.12 X |
| 3,809,635 | 5/1974 | Gillot et al. | 204/192.12 |
| 3,855,110 | 12/1974 | Quinn et al. | 204/192.12 X |
| 3,884,787 | 5/1975 | Kuehnle | 204/192.12 |
| 3,968,018 | 7/1976 | Lane et al. | 204/192.12 X |
| 3,976,555 | 8/1976 | Von Hartel | 204/192.12 X |
| 4,013,539 | 3/1977 | Kuehnle | 204/298 |
| 4,031,424 | 6/1977 | Penfold et al. | 204/192.12 |
| 4,151,064 | 4/1979 | Kuehnle | 204/298 |
| 4,183,797 | 1/1980 | Kennedy et al. | 204/298 |
| 4,309,261 | 1/1982 | Harding et al. | 204/192.12 X |
| 4,376,025 | 3/1983 | Zoga | 204/192.12 |
| 4,405,435 | 9/1983 | Takashi et al. | 204/298 |
| 4,530,750 | 7/1985 | Aisenberg et al. | 204/298 |
| 4,978,586 | 12/1990 | Chambaere et al. | 428/625 |

FOREIGN PATENT DOCUMENTS

| | | |
|---|---|---|
| 0069635 | 6/1982 | European Pat. Off. . |
| 0152577 | 12/1984 | European Pat. Off. . |
| 599565 | 7/1934 | Fed. Rep. of Germany . |
| 2400587 | 7/1974 | Fed. Rep. of Germany . |
| 142966 | 5/1979 | Fed. Rep. of Germany . |
| 1354544 | 10/1964 | France . |
| 1545284 | 11/1968 | France . |
| 1362735 | 8/1974 | United Kingdom . |

OTHER PUBLICATIONS

IBM Technical Disclosure Bulletin, vol. 19, No. 8, Jan. 1977, Vapor Deposition of Multicomponent Layers, A. Bohg and M. Briska, p. 3096.

Journal of Applied Physics, vol. 40, No. 4, Magnetic Domain Nucleation and Propagation in Fein Wires, Turner et al., Mar. 1969, pp. 1864 & 1869.

*Primary Examiner*—Nam X. Nguyen
*Attorney, Agent, or Firm*—Foley & Lardner

[57] ABSTRACT

The invention relates to a process for treating an elongated, coated substrate, whereby treatment comprises the application by cathode sputtering of a material containing at least one component and whereby the composition of this material has been chosen in accordance with the difference between the composition of the coating or the surface of the coating as measured and the desired composition of the coating or the surface of the coating.

13 Claims, 2 Drawing Sheets

PROCESS AND APPARATUS FOR THE TREATMENT OF COATED, ELONGATED SUBSTRATE, AS WELL AS SUBSTRATES THUS TREATED AND ARTICLES OF POLYMERIC MATERIAL REINFORCED WITH THESE SUBSTRATES

This application is a continuation of application Ser. No. 07/107,412, filed Oct. 13, 1987, now abandoned.

The invention primarily relates to a process for treating an elongated substrate, such as a wire, a strip, a cord etc., whereby this substrate has already been coated.

Coating processes for elongated substrates such as a steel wire, are generally known. The coating can be applied electrolytically, by immersion in a bath of molten metal, etc. A number of coating processes are known that permit the rapid application of relatively thick coatings. It is well known how to apply metal coatings of brass (a copper zinc alloy) or zinc onto steel wires, strips etc. and how to apply further treatments to these wires, strips etc. to obtain the desired finished products. It is for instance known how to draw, to roll out etc. such coated wires, strips etc. or intermediate products and to combine these wires, strips etc. to obtain e.g. cords as final products.

The purpose of these brass, zinc etc, coatings on these elongated substrates is usually to provide the final products made therefrom with certain properties, for instance sufficient corrosion resistance, sufficient adhesion to rubber or plastic if these final products are used as reinforcements. However, the presence of this first coating of brass or zinc on the elongated intermediate substrates as for example steel wire also serves other purposes, as for example the ease of drawing, rolling etc. of the intermediate products during the intermediate steps prior to the production of the desired final products.

It has now been determined, that the application of such a coating with the desired properties, for instance, the coating thickness or the coating composition on these intermediate products can be carried out in a good way so that intermediate products with coatings with desirable properties result. On the other hand, it has been found that the properties of the first coating can be changed considerably during the intermediate treatment, i.e. prior to the manufacture of the finished product, e.g. during the drawing, rolling, cabling, etc. processes, as a result of which the properties of the final products thus obtained are not always satisfactory.

It is an object of the invention to provide a process for treating an elongated substrate, such as a wire, a strip, a cord, etc., that is already provided with a coating, to obtain thereby a final product with a coating suitable for the applications of this final product.

The process according to the invention for the treatment of the coated, elongated substrate is characterized in that the treatment comprises the application by cathodic sputtering of a material containing at least one component and whereby the composition of this material has been chosen in accordance with the difference between the composition of the coating or the surface of the coating as measured and the desired compositions of the coating or the coating surface.

The process according to the invention offers the important advantage that it allows final products with a coating or coating surface of the desired composition to be obtained rapidly and efficiently.

The process according to the invention offers the further advantage making it possible to provide intermediate products with a coating of a certain composition or basic composition, whereby the final properties of the coating selected in function of the ultimate application of the end product can rapidly and easily be attained. Intermediate products with a coating of a specific composition can be obtained by means of other, known coating techniques.

According to the process of the invention, the inert sputtering gas is preferably partially replaced by a reactive gas such as nitrogen or a sulphur containing gas such as $H_2S$. The use of a mixture of a reactive gas and an inert gas offers the advantage that it is then possible to apply typical coatings onto already coated substrates. This typical additional coating then consists of reaction products or compounds of the cathode material and the reactive gas, e.g. molybdenum, cobalt or nickel sulphides, etc. for a molybdenum, cobalt or nickel etc. cathode and a reactive gas such as $H_2S$, or titanium nitride for a titanium cathode and a reactive gas such as nitrogen.

According to the process of the invention, the cathode preferably consists of an elongated casing, for instance a circular cylindrical surface, whereby the elongated substrate travels axially through the cathode.

The elongated substrate is preferentially maintained at ground potential. An alternating potential is applied to the two electrodes, if so desired.

It has been found to be advantageous to feed the inert sputtering gas and the substrate to be coated through the cathode in opposite directions.

It has been found to be especially advantageous to clean the substrate to be coated by glow discharge cleaning prior to its being treated in the high vacuum chamber (plasma coating by cathode sputtering). This glow discharge cleaning step is preferably preceded by a cleaning process using induction heating under vacuum.

The invention also relates to an apparatus for treating an elongated, coated substrate comprising at least a chamber provided with means to generate a high vacuum within this chamber, a cathode mounted inside the chamber, and means to introduce an inert sputtering gas, such as argon, into this chamber.

The apparatus according to the invention is characterized in that the apparatus is also provided with means for guiding the elongated substrate through the high vacuum chamber and with means to maintain a sufficiently high potential difference between the anodic substrate and the cathode present in the high vacuum chamber, thus causing a discharge between the two electrodes. The cathode consists of a material comprising at least one component of the coating to be applied to the substrate.

The cathode is preferably an elongated casing, such as a circular cylindrical surface.

The invention also relates to the elongated substrates treated according to the process and in the apparatus according to the invention. Such a substrate can be made of metal, in particular steel, and can have a coating of brass or zinc. The thickness of this brass coating is preferably 0.1 to 0.35 microns, in particular 0.15 to 0.25 microns. The zinc coating thickness is preferably 0.1 to 3 microns, in particular 0.2 to 2 microns.

The elongated substrate according to the invention is preferably provided with a second coating after the cathode sputtering treatment. The material of this coating to be applied by cathodic sputtering is chosen from molybdenum, cobalt, copper, zinc, nickel, iron, aluminium, titanium or their alloys.

The material of this second coating to be applied by cathode sputtering can also be selected from compounds of molybdenum, cobalt, copper, zinc, nickel, iron, aluminium, titanium or their alloys. In this last instance, the inert sputtering gas, such as argon, is partially replaced by a reactive gas such as nitrogen, $H_2S$, etc.

The thickness of this second coating as obtained by cathode sputtering is preferably 20 to 500 Å, in particular 50 to 200 Å. Additional treatments can also be performed to cause the second coating to diffuse partially into the coating already present.

Finally, the invention also relates to articles of polymeric material that have been reinforced with at least one elongated substrate according to the invention.

Figure 2:
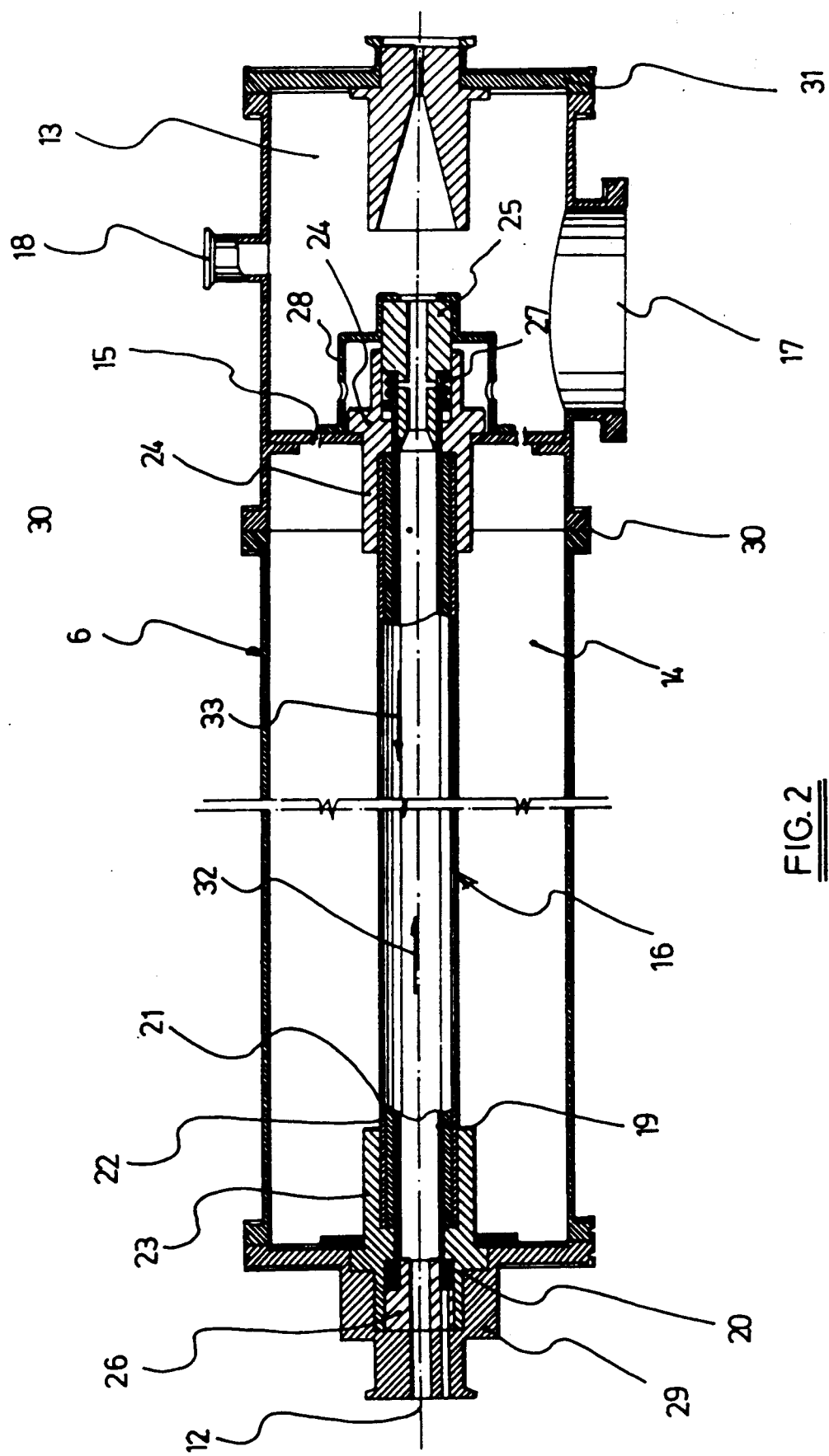

The invention will now be further explained in the following detailed description and accompanying drawing, wherein:

FIG. 1 represents a flow chart of the complete line of which the apparatus according to the invention forms a part, and FIG. 2 represents a longitudinal section of an apparatus according to the invention.

In FIG. 1 parts of a complete line are indicated by numbers 1-10, whereby number 6 refers to the apparatus according to the invention. The elongated substrate 12 to be treated, such as a wire, strip, cord, etc. and which is already provided with a coating, is reeled off a coil or such means in station 1 and is fed through chambers 2 and 3 with vacuum seal lock 4, and high vacuum cleaning station 5 into the coating apparatus 6, whereupon it is rewound onto a coil 7, thereby passing through chamber 3' with vacuum seal lock 4' and chamber 2'. Such a line has for instance been described in GB patent 1 362 735 in which the two high vacuum chambers 5 and 6 are preceded and succeeded by two vacuum chambers 2 and 3 and 2' and 3' respectively. Such a line without the high vacuum coating chamber 6 or apparatus 6 has also been described in the Dutch patent application no. 86.02760 which has been filed simultaneously with the present application.

The vacuum chambers 2 and 2' are connected to a Roots vacuum booster 8 which is known per se, whereas the chambers 3 and 3' are connected to a rotary piston vacuum pump 9. The high vacuum chambers 5 and 6 are connected to a turbomelecular pump 10. Between the atmosphere (unwinding and rewinding stations 1 and 7) and the chambers 2 and 2' respectively, suitable means of passage are provided as between the chambers 2 and 3 and between the chambers 2' and 3' (openings 11 and 11'). Between the chambers 3 and 5 and between the chambers 3' and 6 vacuum tight valves 4 and 4' respectively, are present.

The line operates as follows. With the Roots vacuum booster 8, with for instance a capacity of 500 m³ per hour, a vacuum of $10^{-1}$ to $10^{-2}$ Torr is achieved in chambers 2 and 2'. The chambers 3 and 3' are evacuated still further with the pump 9, with for instance a capacity of 10 m³ per hour, to a final pressure of for example $10^{-2}$ Torr or lower. The high vacuum chambers 5 and 6 are evacuated using the turbomolecular vacuum pump 10 to a high vacuum, for instance $10^{-4}$ to $10^{-7}$ Torr. During the evacuation of chambers 5 and 6, the valves 4 and 4' are completely closed. After this situation has been reached, and valves 4 and 4' have been opened, the line is ready to start the process for treating the elongated substrate 12 which has already been coated beforehand.

FIG. 2 shows the longitudinal section of a typical vacuum chamber 6. This chamber consists of two sections 13 and 14, interconnected by the openings 15. The actual piece of equipment 16 for the treatment of the elongated substrate 12 is contained in section 14 of the vacuum chamber. The section 13 is provided with connectors 17 for the turbomolecular pump 10 and with connectors 18 for the supply of an inert gas, such as argon, nitrogen, etc.

The piece of equipment 16 comprises a circular cylindrical cathode 19 with cable connectors 20 to provide the electrical potential. This cathode is for example a copper tube. The cathode 19 is supported by a tube 21, made for instance for stainless steel, and subsequently by a tube 22 made from insulating material, for example aluminium oxide. Both ends of both tubes 21 and 22 are incorporated in the insulating supports 23 and 24. Tubes 21 and 22 can in theory be replaced by a single tube made from insulating material, in which case the wall thickness of this tube is about equal to the sum of the wall thicknesses of tubes 21 and 22. The ends of the cathode 19 have been incorporated into the insulating supports 25 and 26. Between the end of the cathode 19 and the insulating support 25, a spring 27 has been provided. The supports 25 and 26 fit into clamping devices 28 and 29. The clamping device 28 has been fixed to the wall between the sections 13 and 14, whereas the clamping device 29 can be screwed onto the end of section 14. It is clear that the spring 27 can be slackened by loosening clamping device 29, as a result of which the cathode 19 is expelled and can thus easily be exchanged for another tube 19. In addition, the vacuum chamber 6 is also provided with flange connection 30, which permits the removal of the cathode 19 without loosening the clamping devices 28 or 29. The lid 31 of the section 13 also has a flange connection. The diameter of the tube 19 is for example about 20 mm, whereas its length is for instance about 500 mm.

The process for treating an elongated substrate that has already been provided with a coating, is as follows. When the line is ready to operate the process, the substrate to be treated is fed through the piece of equipment 16 as indicated by the arrow 32. The pump is switched off and an inert sputtering gas, such as argon, is fed into the vacuum chamber 6 or in the section 13 and 14 in a continuous manner until a pressure between 0.1 and 0.5 Torr, for instance 0.2 Torr, has been reached. A sufficiently high voltage difference is maintained between the cathode 19 and the substrate 12 as anode, so that a glow discharge is established and a plasma is formed. This may occur at a voltage difference of for example 200 to 300 V and a current between 300 and 600 mA, for example 450 mA. During its passage through the cathode 19, the substrate 12 is coated by cathode sputtering with the cathode material. In some instance, it is advantageous to replace the inert sputtering gas, such as argon, partially by a reactive gas, such as nitrogen or a sulphur-containing gas, such as $H_2S$. Then the inert gas ions mainly cause the cathode material 19 to sputter, whereas the active gas ions react with the cathode material 19. The substrate 12 will preferably be kept at ground potential. It is also possible to apply an alternating potential between the cathode 19 and the substrate 12 in order to attain the so-called RF-state. Triode sputtering is also possible with the apparatus according to the invention.

An important characteristic of the process according to the invention is that the inert sputtering gas and the reactive gas, if present, are led through the cathode 19 in the direction of the arrow 33. This means that the substrate 12 and the sputtering gas move in opposite directions within the evacuated section 14 and in particular within the cathode 19. This can for example be achieved by ensuring a lower pressure in chamber 3 than in chamber 3'.

The process according to the invention is particularly suitable for metal substrates, such as steel wires, steel cords, etc. which have been coated with zinc, brass, etc. The brass coating preferably has a thickness of 0.1 to 0.3 microns, preferably 0.15 to 0.25 microns and the thickness of the zinc coating is 0.1 to 3 microns, preferably 0.2 to 2 microns. The material of cathode 19 is preferably chosen from molybdenum, cobalt, copper, zinc, nickel, iron, aluminium, titanium or their alloys. It has been found that coating thicknesses of 20 to 500 Å, in particular 50 to 200 Å were applied onto the elongated substrate when this was fed at high speeds (20 m per min or more) when using the process according to the invention.

The process according to the invention is further characterized in that the substrate 12 to be treated is cleaned in the high vacuum chamber 5 by plasma cleaning, before it is treated in the high vacuum chamber 6 or before its cathode sputtering coating. (see FIG. 1). Preferably, the elongated substrate 12 is cleaned by induction heating under vacuum, for example in chamber 2, before the plasma cleaning.

Within the context of the invention, improvements can be introduced both with regard to the process and to the apparatus. For instance, a coil can be fitted around the cathode 19 in section 14, so as to generate a magnetic field between the cathode 19 and the substrate 12, which further improves the quality of the substrate 12.

We claim:

1. A process for treating an elongated substrate comprising the steps of:
    forming the substrate of steel;
    applying to the steel substrate a first coating of brass by a non-sputtering technique, wherein the first non-sputtered coating is applied with a thickness of 0.1 to 0.35 microns;
    applying by cathode sputtering a second coating to the substrate, the second coating being cobalt.

2. The process according to claim 1, comprising sputtering the second coating with one of an inert sputtering gas and a gas having an inert sputtering gas with a reactive gas.

3. The process according to claim 1, further including leading the elongated substrate longitudinally through a cathodic elongated casing.

4. The process according to claim 3, further comprising forming said elongated casing with a cylindrical inner surface.

5. The process according to claim 3, further comprising keeping said elongated substrate at ground potential.

6. The process according to claim 5, further comprising applying an alternating potential to said elongated substrate and said cathodic elongated casing.

7. The process according to claim 1, further comprising moving an inert sputtering gas and said elongated substrate in opposite directions through a cathode.

8. The process according to claim 7, further comprising replacing a portion of said inert sputtering gas by a sulphur containing gas.

9. The process according to claim 7, further comprising replacing a portion of said inert sputtering gas by a nitrogen gas.

10. The process according to claim 1, further comprising cleaning said elongated substrate by plasma cleaning.

11. The process according to claim 10, further comprising cleaning said elongated substrate by induction heating.

12. The method recited in claim 1 wherein the second sputtered coating is applied with a thickness of 20 to 500 Angstroms.

13. The method recited in claim 12 wherein the second sputtered coating is applied with a thickness between 50 and 200 Angstroms.

* * * * *